United States Patent
Kim et al.

(10) Patent No.: US 11,145,680 B2
(45) Date of Patent: Oct. 12, 2021

(54) DISPLAY PANEL AND DISPLAY DEVICE

(71) Applicant: LG DISPLAY CO., LTD., Seoul (KR)

(72) Inventors: Junhyung Kim, Paju-si (KR); Jihye Park, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 86 days.

(21) Appl. No.: 16/707,218

(22) Filed: Dec. 9, 2019

(65) Prior Publication Data

US 2020/0203383 A1 Jun. 25, 2020

(30) Foreign Application Priority Data

Dec. 20, 2018 (KR) ........................ 10-2018-0165764

(51) Int. Cl.
*G02F 1/1339* (2006.01)
*H01L 27/12* (2006.01)
*G02F 1/1362* (2006.01)

(52) U.S. Cl.
CPC .......... *H01L 27/124* (2013.01); *G02F 1/1339* (2013.01); *G02F 1/136286* (2013.01)

(58) Field of Classification Search
CPC .................................................. H01L 27/124
See application file for complete search history.

(56) References Cited

U.S. PATENT DOCUMENTS

| | | | | |
|---|---|---|---|---|
| 2008/0316414 | A1* | 12/2008 | Nakagawa | G02F 1/136286 349/149 |
| 2011/0222003 | A1* | 9/2011 | Kinoe | G02F 1/133512 349/104 |
| 2016/0349558 | A1* | 12/2016 | Shishido | G02F 1/13338 |
| 2016/0377944 | A1* | 12/2016 | Park | G02F 1/133512 349/42 |
| 2017/0219895 | A1* | 8/2017 | Yu | G02F 1/1368 |
| 2019/0129220 | A1* | 5/2019 | Wang | G02F 1/13394 |

* cited by examiner

*Primary Examiner* — Sang V Nguyen
(74) *Attorney, Agent, or Firm* — Birch, Stewart, Kolasch & Birch, LLP

(57) ABSTRACT

A display panel and a display device including the display panel are discussed. The display panel includes a substrate having an active area, and a non-active area surrounding the active area and having a first area, a second area and a third area which are spaced apart from one another, at least one signal line disposed in each of the first, second and third areas, at least one connection pattern disposed on the at least one signal line, and a sealant disposed in the non-active area. In at least one of the first, second and third areas of the non-active area of the display panel and display device, i) at least one signal line and at least one connection pattern overlap each other, and ii) at least one signal line includes an area in the form of a mesh with at least one opening.

12 Claims, 12 Drawing Sheets

DISPLAY PANEL AND DISPLAY DEVICE

CROSS-REFERENCE TO RELATED APPLICATION

This application claims the priority benefit of Korean Patent Application No. 10-2018-0165764, filed on Dec. 20, 2018 in the Korean Intellectual Property Office, the disclosure of which is incorporated herein by reference in its entirety.

BACKGROUND

Field of the Disclosure

The present disclosure relates to display panels and display devices.

Description of the Background Art

Liquid crystal display devices have a higher contrast ratio and lower power consumption. Liquid crystal display devices are advantageous to display moving images, and therefore are used in many types of electronic devices, such as a notebook computer, a monitor, and a TV, or the like. Liquid crystals are thin and long in molecular structure, and have optical anisotropy, which has directionality in arrangement, and polarizing properties, in which the direction of molecular arrangement is changed according to their size when placed in an electric field. Liquid crystal display devices display images on a screen using such optical anisotropy and a polarizing property of the liquid crystal.

A typical process of fabricating the liquid crystal display is divided into a substrate fabricating process for forming an array substrate and a color filter substrate, a cell process for fabricating a liquid crystal panel, and a module process for integrating the liquid crystal panel and a backlight unit.

In the process of fabricating the liquid crystal panel, to bond the array substrate and the color filter substrate together, a sealant is formed on the periphery of the substrates. The sealant also serves as maintaining a cell gap. For the reliability of the liquid crystal panel, it is important to harden the sealant sufficiently, and it is also important to shorten a time required for hardening the sealant.

SUMMARY

Accordingly, the present disclosure is directed to display panels and display devices that substantially obviate one or more problems due to limitations and disadvantages of the background art.

It is at least one object of the present disclosure to provide a display panel and a display device having a structure for allowing a sealant disposed in a non-active area to be harden or cured sufficiently.

It is at least one object of the present disclosure to provide a display panel and a display device having a structure for allowing a sealant material disposed in a non-active area to be harden or cured rapidly.

It is at least one object of the present disclosure to provide a display panel and a display device having a structure for allowing a size of a non-active area to be reduced.

In accordance with one aspect of the present disclosure, a display panel and a display device are provided that comprise a substrate comprising an active area, and a non-active area surrounding the active area and comprising a first area, a second area and a third area, which are spaced apart from one another, at least one signal line disposed in each of the first, second and third areas, at least one connection pattern disposed on the at least one signal line, and a sealant disposed in the non-active area. In at least one of the first, second and third areas of the non-active area of the display panel and display device, i) the at least one signal line and the at least one connection pattern overlap each other, ii) the at least one signal line comprises an area in the form of a mesh with at least one opening, iii) the at least one connection pattern may not overlap a part or all of the at least one opening, and iv) the sealant can overlap a part or all of at least one of the first, second and third areas of the non-active area.

In the first area, an area in which the at least one signal line has the at least one opening can further comprise at least one active layer overlapping at least a part of the at least one signal line.

A first connection pattern and a second connection pattern can be disposed over the at least one active layer, and each of the first and second connection patterns can be electrically connected to the at least one active layer.

The first and second connection patterns are disposed to be spaced apart from each other, and each of the first and second connection patterns can be connected to a plurality of data lines arranged in the active area.

In the second area, the at least one connection pattern can have at least one opening at a location corresponding to the least one opening of the at least one signal line.

At least one insulating film can be disposed between the at least one connection pattern and the least one signal line disposed in the second area, and the at least one connection pattern can be electrically connected to the least one signal line through at least one hole formed in the insulating film in an area in which the at least one connection pattern overlaps the least one signal line.

At least one gate driving circuit is disposed in the third area, and the at least one connection pattern disposed in the third area can be electrically connected to the gate driving circuit.

The sealant can overlap the at least one opening of the at least one signal line.

In accordance with one aspect of the present disclosure, a display panel comprising: a first substrate comprising an active area, and a non-active area surrounding the active area and comprising a first area, a second area and a third area which are spaced apart from one another; at least one signal line disposed in each of the first, second and third areas; at least one connection pattern disposed over the at least one signal line; a second substrate facing the first substrate; and a sealant disposed between the first substrate and the second substrate, and disposed in the non-active area, wherein in the at least one of the first, second and third areas, the at least one one signal line and the at least one connection pattern overlap each other, and the at least one signal line comprises an area in the form of a mesh with at least one opening, wherein the at least one connection pattern does not overlap all or a part of the at least one opening.

In accordance with embodiments of the present disclosure, it is possible to provide a display panel and a display device having a structure for allowing a sealant disposed in a non-active area to be harden or cured sufficiently.

In accordance with embodiments of the present disclosure, it is possible to provide a display panel and a display device having a structure for allowing a sealant material disposed in a non-active area to be harden or cured rapidly.

In accordance with embodiments of the present disclosure, it is possible to provide a display panel and a display device having a structure for allowing a size of a non-active area to be reduced.

Additional features and advantages of the disclosure will be set forth in the description which follows and in part will be apparent from the description, or can be learned by practice of the disclosure. The objectives and other advantages of the disclosure will be realized and attained by the structure particularly pointed out in the written description and claims hereof as well as the appended drawings.

DETAILED DESCRIPTION OF THE EMBODIMENTS

Figure 1:
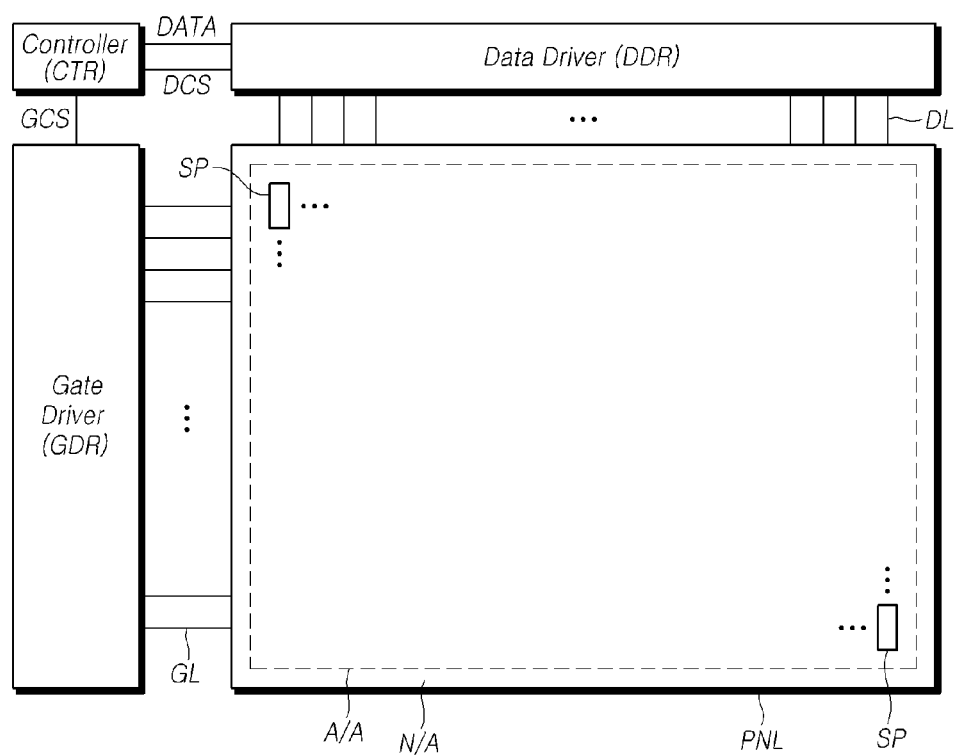
FIG. 1 is a diagram schematically illustrating a system configuration of an electronic device according to embodiments of the present disclosure.

The advantages and features of the present disclosure and methods of achieving the same will be apparent by referring to aspects of the present disclosure as described below in detail in conjunction with the accompanying drawings. However, the present disclosure is not limited to the aspects set forth below, but can be implemented in various different forms. The following aspects are provided only to completely disclose the present disclosure and inform those skilled in the art of the scope of the present disclosure, and the present disclosure is defined only by the scope of the appended claims.

In addition, the shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the present specification. Further, in the following description of the present disclosure, detailed description of well-known functions and configurations incorporated herein will be omitted when it is determined that the description can make the subject matter in some embodiments of the present disclosure rather unclear. The terms such as "including", "having", "containing", "comprising of", and "consist of" used herein are generally intended to allow other components to be added unless the terms are used with the term "only". As used herein, singular forms are intended to include plural forms unless the context clearly indicates otherwise.

In interpreting any elements or features of the embodiments of the present disclosure, it should be considered that any dimensions and relative sizes of layers, areas and regions include a tolerance or error range even when a specific description is not conducted.

Terms, such as first, second, A, B, (A), or (B) can be used herein to describe elements of the disclosure. Each of the terms is not used to define essence, order, sequence, or number of an element, but is used merely to distinguish the corresponding element from another element. When it is mentioned that an element is "connected" or "coupled" to another element, it should be interpreted that a third element can be "interposed" between the elements or the elements can be "connected" or "coupled" to each other via a third element as well as that one element is directly connected or coupled to another element. Spatially relative terms, such as, "on", "over", "above", "below", "under", "beneath", "lower", "upper", "near", "close", "adjacent", and the like, can be used herein to describe one element or feature's relationship to another element(s) or feature(s) as illustrated in the figures, and it should be interpreted that one or more elements can be further "interposed" between the elements unless the terms such as "directly", "only" are used.

Any elements or features of the embodiments of the present disclosure are not limited to a specific meaning of the terms described above. The terms as used herein are merely for the purpose of describing examples and are not intended to limit the present disclosure. Although the terms "first", "second", and the like are used for describing various elements, or features, these elements are not confined by these terms. These terms are merely used for distinguishing one element from other elements. Therefore, a first element to be mentioned below can be a second element in a technical concept of the present disclosure.

The elements or features of various exemplary embodiments of the present disclosure can be partially or entirely bonded to or combined with each other and can be interlocked and operated in technically various ways as can be fully understood by a person having ordinary skill in the art, and the various exemplary embodiments can be carried out independently of or in association with each other.

Hereinafter, exemplary embodiments of the present disclosure will be described in detail with reference to the accompanying drawings.

FIG. 1 is a diagram schematically illustrating a system configuration of an electronic device according to embodiments of the present disclosure. All the components of the electronic device according to all embodiments of the present disclosure are operatively coupled and configured.

The electronic device according to embodiments of the present disclosure can comprise a display device, a lighting device, a light emitting device, or the like. Hereinafter, for convenience of description, discussions on the electronic device are conducted based on the display device. It should be understood that embodiments or examples of the present disclosure can be equally applied to, any electronic devices comprising a transistor, such as the lighting device, the light emitting device, or the like, as well as the display device. Any full or partial combination of one or more embodiments or examples of the present disclosure into such electronic devices is also part of the present disclosure.

Referring to FIG. 1, and in accordance with embodiments of the present disclosure, the electronic device can comprise a panel PNL for displaying images or outputting light, and a driving circuit (or a driver) for driving the panel PNL.

The panel PNL can comprise a plurality of data lines DL, a plurality of gate lines GL, and a plurality of subpixels SP that can be arranged in areas defined by the plurality of data lines DL and the plurality of gate lines GL in a matrix.

The plurality of data lines DL and the plurality of gate lines GL can be arranged in the panel PNL such that the data lines DL and the gate lines GL intersect each other. For example, the plurality of gate lines GL can be arranged in rows or columns, and the plurality of data lines DL can be arranged in the columns or the rows. Hereinafter, for convenience of description and ease of understanding, it can be assumed that the plurality of gate lines GL is arranged in the rows and the plurality of data lines DL is arranged in the columns.

In addition to the plurality of gate lines GL and the plurality of data lines DL, the panel PNL can further comprise other types of signal lines depending on a structure of a subpixel, or the like. For example, the display panel can further comprise at least one driving voltage line, at least one reference voltage line, at least one common voltage line, or the like.

The panel PNL can be one of various types of panels, such as a liquid crystal display (LCD) panel, an organic light emitting diode (OLED) panel, or the like.

Types of signal lines arranged in the panel PNL can differ depending on a subpixel structure, a panel type (an LCD panel, an OLED panel, etc.), or the like. Herein, the signal line can comprise an electrode to which a signal is applied.

The panel PNL can comprise an active area A/A in which an image is displayed, and a non-active area N/A in which an image is not displayed and which is a peripheral area of the active area A/A. Here, the non-active area N/A can sometimes be referred to as a bezel area or an edge of the panel or the display device.

The plurality of subpixels SP can be arranged in the active area A/A for displaying images.

Conductive pads to which a data driver DDR is electrically connected can be arranged in the non-active area N/A, and a plurality of data link lines can be arranged to connect between the conductive pads and the plurality of data lines DL. Here, the conductive pads can be formed from an array or other arrangement of conductive traces or patches. Here, the plurality of data link lines can be either parts of the plurality of data lines DL extending to the non-active area N/A, or separate patterns electrically connected to the plurality of data lines DL.

Further, gate-driving-related lines can be arranged in the non-active area N/A for delivering a voltage (signal) needed for driving a gate of at least one transistor included in at least one subpixel to a gate driver GDR through the conductive pads to which the data driver DDR is electrically connected. For example, the gate-driving-related lines can comprise a clock line for delivering clock signals, a gate voltage line for delivering gate voltages VGH and VGL, a gate driving control signal line for delivering various control signals needed for generating scan signals, or the like. The gate-driving-related lines can be arranged in the non-active area N/A, unlike the gate lines GL arranged in the active area A/A.

The driving circuit can comprise the data driver DDR for driving the plurality of data lines DL, the gate driver GDR for driving the plurality of gate lines GL, and a controller CTR for controlling the data driver DDR and the gate driver GDR.

The data driver DDR can drive the plurality of data lines DL by providing data voltages to the plurality of data lines DL.

The gate driver GDR can drive the plurality of gate lines GL by providing scan signals to the plurality of gate lines GL.

The controller CTR can control driving operations of the data driver DDR and the gate driver GDR by providing various control signals DCS and GCS needed for driving the data driver DDR and the gate driver GDR. The controller CTR can supply image data DATA to the data driver DDR.

The controller CTR enables a scan of subpixels to be initiated according to a timing processed in each frame. The controller CTR converts image data inputted from other devices or image providing sources to a data signal form used in the data driver DDR, outputs image data DATA obtained from the converting, and enables data lines to be updated during the scan of the subpixels.

In order to control the data driver (DDR) and the gate driver (GDR), the controller (CTR) receives a timing signal, such as a vertical synchronous signal (Vsync), a horizontal synchronous signal (Hsync), an input data enable (DE) signal, a clock signal (CLK), or the like, from other devices or image providing sources, such as a host system, and generates various control signals and outputs the generated signals to the data driver (DDR) and the gate driver (GDR).

For example, to control the gate driver GDR, the controller CTR outputs several types of gate control signals GCS including a gate start pulse GSP, a gate shift clock GSC, a gate output enable signal GOE, or the like.

In addition, to control data driver DDR, the controller CTR outputs various data control signals DCS including a source start pulse SSP, a source sampling clock SSC, a source output enable signal SOE, or the like.

The controller can be a timing controller used in the typical display technology or a control apparatus/device capable of additionally performing other control functionalities in addition to the typical function of the timing controller.

The controller CTR can be implemented either as a separate component from the data driver DDR, or as an integrated circuit by being integrated with the data driver DDR.

The data driver DDR drives a plurality of data lines DL by providing data voltages to the plurality of data lines DL after having received image data DATA from the controller CTR. Herein, the data driver DDR can sometimes be referred to as a source driver.

The data driver DDR can transmit various signals to and/or receive them from the controller CTR through various interfaces.

The gate driver GDR sequentially drives a plurality of gate lines GL by sequentially providing scan signals to the plurality of gate lines GL. Herein, the gate driver GDR can sometimes be referred to as a scan driver.

According to the control of the controller CTR, the gate driver GDR sequentially provides scan signals with a turn-on voltage level or a turn-off voltage level to the plurality of gate lines GL.

When a specific gate line is driven by a scan signal from the gate driver GDR, the data driver DDR converts image data DATA received from the controller CTR into analog data voltages and provides the obtained analog data voltages to the plurality of data lines DL.

The data driver DDR can be located on, but not limited to, only one side (e.g., an upper side or a lower side) of the panel PNL, or in some embodiments, be located on, but not limited to, two sides (e.g., the upper side and the lower side) of the panel PNL depending on a driving scheme, a panel design scheme, or the like.

The gate driver GDR can be located on, but not limited to, only one side (e.g., a left side or a right side) of the panel PNL, or in some embodiments, be located on, but not limited to, two sides (e.g., the left side and the right side) of the panel PNL depending on a driving scheme, a panel design scheme, or the like.

The data driver DDR can be implemented by comprising one or more source driver integrated circuits SDIC.

Each source driver integrated circuits SDIC can comprise a shift register, a latch circuit, a digital to analog converter DAC, an output buffer, or the like. In some embodiments, the data driver DDR can further include one or more analog to digital converters ADC.

Each source driver integrated circuit SDIC can be connected to at least one pad, such as a bonding pad, of the panel PNL in a tape automated bonding (TAB) type or a chip on glass (COG) type, or be directly disposed on the panel PNL. In some embodiments, each source driver integrated circuit SDIC can be integrated and disposed on the panel PNL. In addition, each source driver integrated circuit SDIC can be implemented in a chip on film (COF) type. In this instance, each source driver integrated circuit SDIC can be mounted on a circuit film and electrically connected to the data lines DL arranged in the panel PNL through the circuit film.

The gate driver GDR can comprise a plurality of gate driving circuits GDC. Here, each of the plurality of gate driving circuits GDC can correspond to one or more of the plurality of gate lines.

Each gate driving circuit GDC can comprise a shift register, a level shifter, and the like.

Each gate driving circuit GDC can be connected to at least one pad, such as a bonding pad, of the panel PNL in a tape automated bonding (TAB) type or a chip on glass (COG) type. Here, the bonding pad can be formed from a conductive trace or patch. Further, each gate driving circuit GDC can be implemented in a chip on film (COF) type. In this instance, each gate driving circuit GDC can be mounted on a circuit film and electrically connected to the gate lines GL arranged in the panel PNL through the circuit film. Each gate driving circuit GDC can be integrated into the panel PNL by being implemented in a gate in panel (GIP) type. For example, each gate driving circuit GDC can be directly formed in the panel PNL.

Figure 2:
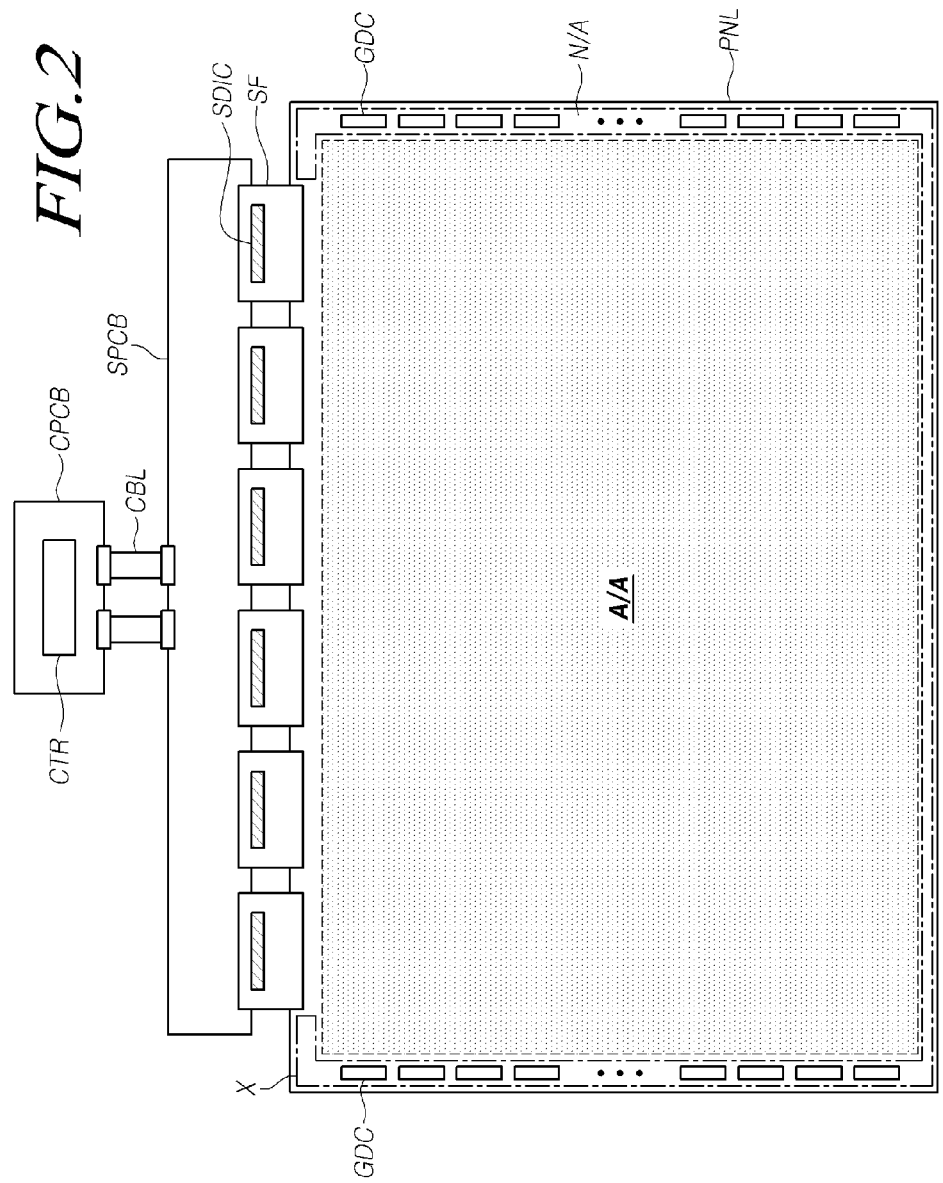
FIG. 2 is a diagram illustrating a system implementation of the electronic device according to embodiments of the present disclosure.

FIG. 2 is a diagram illustrating a system implementation of the electronic device according to embodiments of the present disclosure.

Referring to FIG. 2, in the electronic device according to embodiments of the present disclosure, the data driver DDR can be implemented in the chip on film (COF) type of various types, such as the TAB, the COG, the COF, the GIP, or the like. Also, the gate driver GDR can be implemented in the gate in panel (GIP) type of various types, such as, the TAB, the COG, the COF, the GIP, or the like.

The data driver DDR can be implemented as one or more source driver integrated circuits SDIC. FIG. 2 illustrates an example of the data driver DDR implemented as a plurality of source driving integrated circuits SDIC.

When the data driver DDR is implemented in the COF type, each source driving integrated circuit SDIC performing the function of the data driver DDR can be mounted on a source side circuit film SF.

The conductive pads arranged in the non-active area N/A of the panel PNL can be electrically connected to one side of the source side circuit film SF.

One or more lines electrically connecting between the source driving integrated circuit SDIC and the panel PNL can be arranged on the source side circuit film SF.

For circuit connections between the plurality of source driving integrated circuits SDIC and other units or electronic elements, the electronic device can comprise at least one source printed circuit board SPCB, and a control printed circuit board CPCB for mounting control units or components, and other electric components, units, or devices.

The other side of the source side circuit film SF in which the source driving integrated circuit SDIC is mounted can be connected to the at least one source printed circuit board SPCB.

For example, the one side and the other side of the source side circuit film SF in which the source driving integrated circuit SDIC is mounted can be electrically connected to the non-active area N/A of the panel PNL and the source printed circuit board SPCB, respectively.

The controller CTR for controlling the data driver DDR, the gate driver GDR, or the like can be disposed on the control printed circuit board CPCB.

Further, a power management integrated circuit PMIC that provides various voltages or currents or controls various voltages or currents to be provided, to the panel PNL, the data driver DDR, the gate driver GDR, and the like can be disposed on the control printed circuit board CPCB.

The source printed circuit board SPCB and the control printed circuit board CPCB can be connected to each other for enabling an electric current to travel through at least one connector CBL. Here, the connector CBL can be a flexible printed circuit FPC, a flexible flat cable, or the like.

The at least one source printed circuit board SPCB and the control printed circuit board CPCB can be integrated into one printed circuit board.

When the gate driver GDR is implemented in the gate in panel (GIP) type, the plurality of gate driving circuits GDC included in the gate driver GDR can be directly formed in the non-active area N/A of the panel PNL.

Each of the plurality of gate driving circuits GDC can output a scan signal to a corresponding gate line arranged in the active area A/A of the panel PNL.

The plurality of gate driving circuits GDC arranged in the panel PNL can receive various signals (a clock signal, a high level gate voltage (VGH), a low level gate voltage (VGL), a start signal (VST), a reset signal (RST), or the like) needed for generating the scan signal through the gate-driving-related lines arranged in the non-active area N/A.

The gate-driving-related lines arranged in the non-active area N/A can be electrically connected to the source side circuit film SF disposed closest to the plurality of gate driving circuits GDC.

Figure 3:
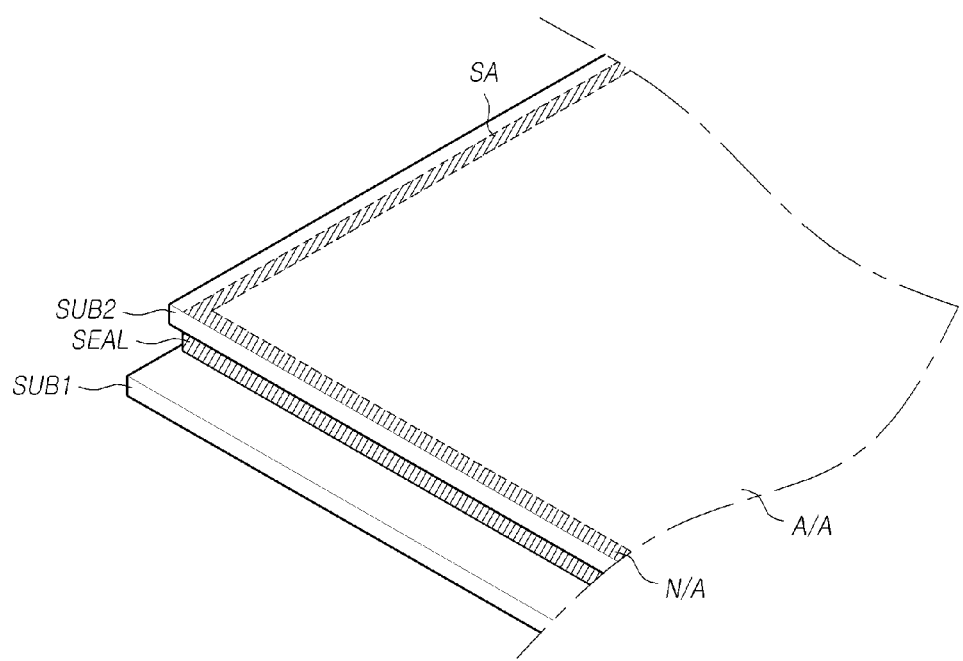
FIG. 3 is a diagram illustrating a part of a display device according to embodiments of the present disclosure.

FIG. 3 is a diagram illustrating a part of a display device according to embodiments of the present disclosure.

Referring to FIG. 3, the display device DP can comprise a first substrate SUB1 and a second substrate facing the first substrate SUB1.

Here, the first substrate SUB1 can be a transistor (TR) array substrate, and the second substrate SUB2 can be a color filter substrate. However, embodiments of the present disclosure are not limited thereto. For example, a color filter can be disposed on the first substrate SUB1.

A liquid crystal layer can be disposed between the first and second substrates SUB1 and SUB2, but embodiments of the present disclosure are not limited thereto.

Further, a sealant SEAL for bonding the first and second substrates SUB1 and SUB2 can be disposed between the first and second substrates SUB1 and SUB2. The sealant SEAL can be disposed along with peripheral areas of the respective first and second substrates SUB1 and SUB2. The sealant SEAL can be also disposed to cover the peripheral areas of the respective first and second substrates SUB1 and SUB2.

As shown in FIG. 1, the plurality of data lines DL, the plurality of gate lines GL, and the plurality of subpixels SP defined by the plurality of data lines DL and the plurality of gate lines GL in a matrix can be arranged in the active area A/A of the first substrate SUB1.

As shown in FIG. 1, the conductive pads to which the data driver DDR is electrically connected can be arranged in the non-active area N/A of the first substrate SUB1. Further, the plurality of data link lines for connecting between the conductive pads and the plurality of data lines DL can be arranged in the non-active area N/A of the first substrate SUB1. Further, gate-driving-related lines can be arranged in the non-active area N/A for delivering a voltage (signal) needed for driving a gate of at least one transistor included in at least one subpixel to a gate driver GDR through the conductive pads to which the data driver DDR is electrically connected.

A color filter for providing colors and a black matrix for preventing the colors from being mixed can be located in the second substrate SUB2, but embodiments of the present disclosure are not limited thereto.

As described above, a plurality of lines for delivering signals (hereinafter, can be referred to as "signal line") can be arranged in the non-active area N/A of the first substrate SUB1.

The plurality of signal lines can be arranged in part or all of the non-active area N/A of the first substrate SUB1 in which the sealant is disposed.

The first substrate SUB1 in which the sealant SEAL is disposed can comprise a plurality of areas. Hereinafter, for convenience of description, discussions are conducted on the plurality of areas of the first substrate SUB1 in which the sealant SEAL is disposed, and which comprises a first area, a second area, and a third area.

At least one of the first, second and third areas can be an area overlapping the sealant.

Here, the first area can be located closer to the active area A/A of the display device DP than the second area, and the second area can be located closer to the active area A/A than the third area. For example, the first area of the first, second and third areas can be located closest to the active area A/A, and the third area can be located farthest from the active region A/A.

Figure 4:
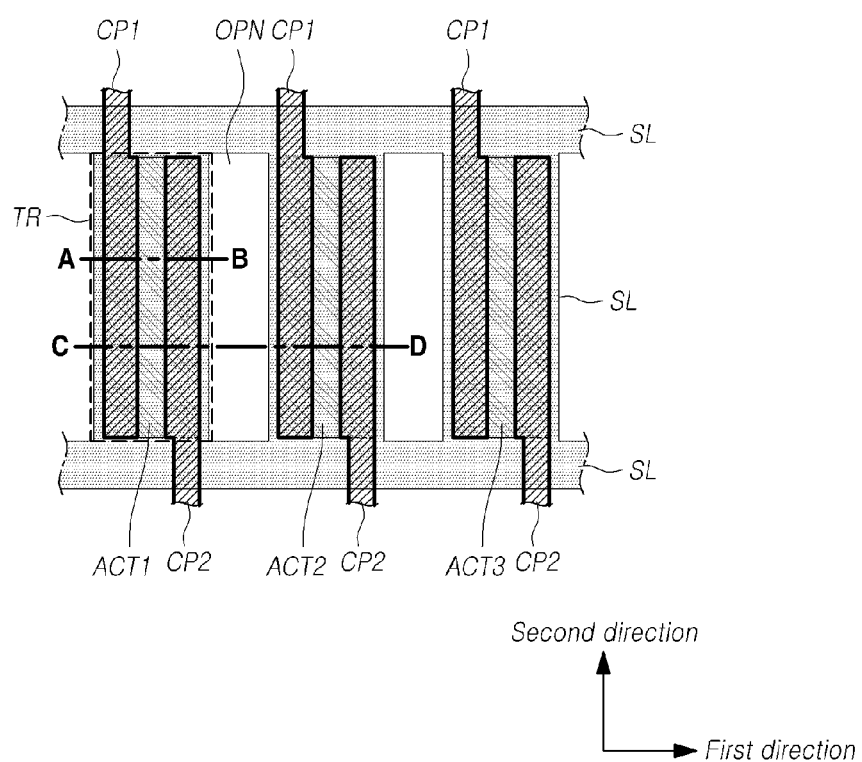
FIG. 4 is a sectional view illustrating a first area corresponding to a part of an X area of FIG. 2.
Figure 5:
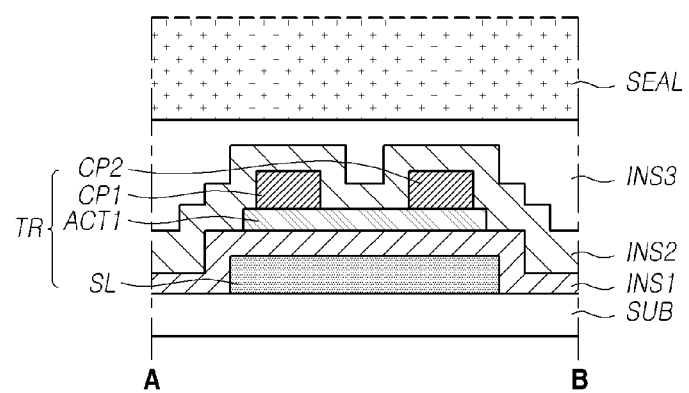
FIG. 5 is a cross-sectional view taken along line A-B of FIG. 4.

FIG. 4 is a sectional view illustrating a first area corresponding to a part of the X area of FIG. 2. FIG. 5 is a cross-sectional view taken along line A-B of FIG. 4.

The first area A1 of the non-active area N/A can be an inspection area. For example, the inspection area can be an area needed for inspecting defects of several types of signal lines disposed over the first substrate SUB1, and comprise a plurality of transistors and a plurality of signal lines.

Referring to FIG. 4, in the first area A1 of the non-active area N/A, a plurality of signal lines can be disposed over the first substrate SUB1.

Some of the plurality of signal lines SL disposed in the first area A1 can have a mesh form with at least one opening OPN. For example, a signal line SL can comprise at least one opening OPN formed by the intersecting or overlapping of at least two signal line patterns extending to a first direction with at least two signal line patterns extending to a second direction crossing the first direction at a certain angle. Here, the at least two signal line patterns extending to the first direction can have a different pattern in a width, length or thickness of the signal line pattern from the at least two signal line patterns extending to the second direction.

A plurality of connection patterns CP1 and CP2 can overlap the signal line SL having the mesh form. Each of the plurality of connection patterns CP1 and CP2 can be in the form of a line extending in a direction in the first area A1, but embodiments of the present disclosure are not limited thereto.

At least one active layer ACT can overlap the signal line SL having the mesh form and the plurality of connection patterns CP1 and CP2. A first connection pattern CP1 and a second connection pattern CP2 disposed on an identical active layer ACT can be disposed to be spaced apart from each other.

The plurality of connection patterns CP1 and CP2 and the active layer ACT may not overlap all or a part of the opening OPN of the signal line SL. For example, the plurality of connection patterns CP1 and CP2 and the active layer ACT which overlap the signal line SL with at least one opening OPN can be disposed not to cover the at least one opening OPN of the signal line SL.

Meanwhile, the signal line SL with at least one opening OPN can be connected to a signal line disposed in the active area A/A.

In the non-active area N/A, the signal line SL with at least one opening OPN, the connection patterns CP1 and CP2, and the active layer ACT can overlap one another, and act as a transistor.

Referring to FIG. 5, a signal line SL can be disposed on the substrate SUB.

A first insulating film INS1 can be disposed on the signal line SL. An active layer ACT can be disposed on the first insulating film INS1.

The active layer ACT can be disposed to overlap the signal line SL.

A first connection pattern CP1 and a second connection pattern CP2 can be disposed to be spaced apart from each other on the active layer ACT A second insulating film INS2 and a third insulating film INS3 can be disposed on the first and second connection patterns CP1 and CP2. Here, the third insulating film INS3 can serve as planarizing the substrate SUB over which a plurality of transistors TR is disposed, but embodiments of the present disclosure are not limited thereto.

A sealant SEAL can be disposed on the third insulating film INS3.

Meanwhile, the signal line SL, the active layer ACT, the first and second connection patterns CP1 and CP2 can act as one transistor TR.

The transistor TR can be used to inspect defects of a plurality of signal lines arranged in the active area A/A.

The sealant SEAL can be disposed in the first area A1. Such a structure is further discussed with reference to FIG. 6.

Figure 6:
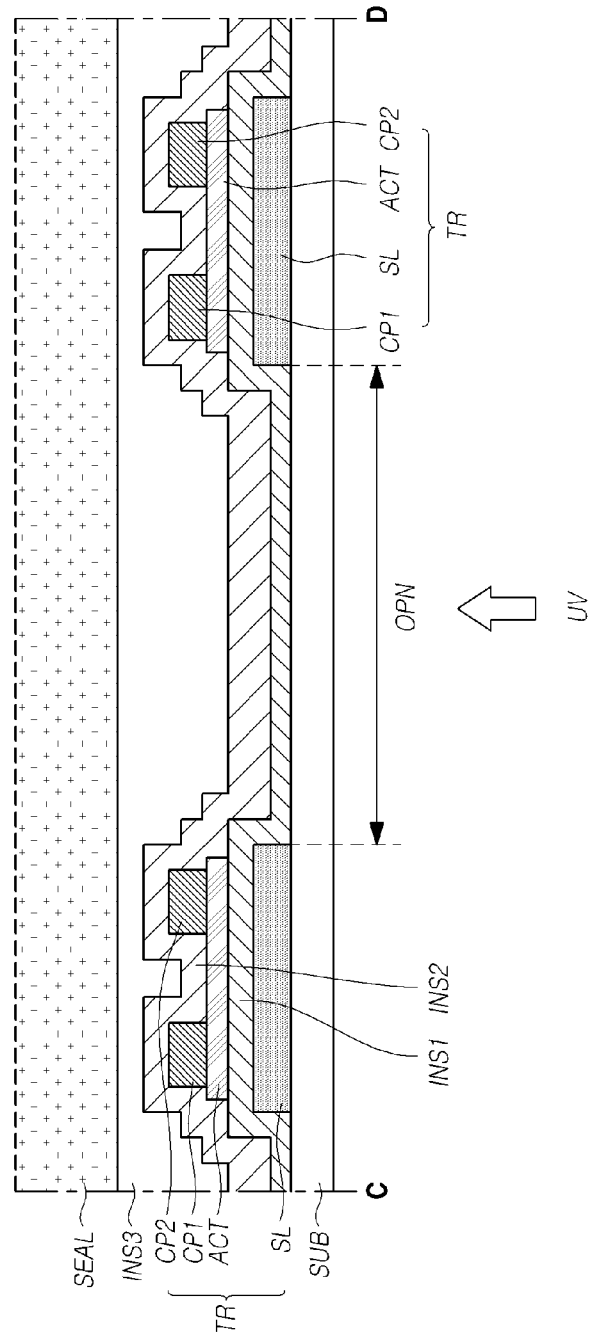
FIG. 6 is a cross-sectional view taken along line C-D of FIG. 4.

FIG. 6 is a cross-sectional view taken along line C-D of FIG. 4.

Referring to FIG. 6, two transistors TR can be disposed to be spaced apart from each other over the substrate SUB in the first area A1.

In other words, only the insulating films INS1, INS2 and INS3 rather than a signal line or an active layer ACT can be arranged between one transistor TR and the other transistor TR.

The third insulating film INS3 can be disposed over the substrate on which the transistors TR are disposed.

Meanwhile, the signal lines SL arranged in the first area A1 can be arranged on an identical layer to a plurality of gate lines arranged in the active area A/A, but embodiments of the present disclosure are not limited thereto.

The first and second connection patterns CP1 and CP2 can be arranged on an identical layer to the gate lines arranged in the active area A/A, but embodiments of the present disclosure are not limited thereto.

The sealant can be disposed on the third insulating film INS3.

The sealant SEAL can be an ultraviolet curable resin that is cured by ultraviolet light UV, but embodiments of the present disclosure are not limited thereto.

In order to form the sealant SEAL, ultraviolet light can be irradiated to an area in which the resin as the sealant is disposed from the back surface of the first substrate SUB1.

The ultraviolet light that has passed through the first substrate SUB1 reaches the material as the sealant SEAL via the first, second and third insulating films INS1, INS2 and INS3, and the material as the sealant SEAL can be hardened or cured by the ultraviolet light.

Like this, in the first area A1 in which the sealant SEAL is disposed, since the signal lines SL have at least one opening OPN, and the active layer ACT and the connection patterns CP1 and CP2 disposed on the signal line SL are disposed not to overlap all or a part of the opening OPN, the ultraviolet light for curing or hardening the material as the sealant SEAL can reach the sealant SEAL easily or sufficiently.

On the contrary, when the signal line SL, the active layer ACT, or the connection patterns CP1 and CP2 is disposed in an area through which the ultraviolet light passes, there is a possibility that the ultraviolet light may not reach the sealant SEAL sufficiently; therefore, there can occur a defect of the display device due to the insufficient curing or hardening of the material as the sealant SEAL. For example, the sealant SEAL may not maintain a gap between the first substrate SUB1 and the second substrate SUB2 due to the insufficient curing or hardening of the material as the sealant SEAL, or a defect that allows the material as the sealant SEAL to flow can occur.

However, according to embodiments of the present disclosure, for hardening or curing of a material as the sealant SEAL, an area through which ultraviolet light passes is provided in the first area A1; therefore, it is possible for the material as the sealant SEAL to be hardened or cured sufficiently.

In addition, as ultraviolet light sufficiently reaches the material as the sealant SEAL, it is possible to reduce a hardening or curing time of the material as the sealant SEAL.

In addition, in accordance with embodiments of the present disclosure, at least one signal line SL is disposed to overlap at least one connection pattern CP and at least one active layer ACT in the non-active area N/A; therefore, it is possible to reduce the size of the non-active area N/A.

Next, discussions are conducted on the second area of the non-active area N/A.

Figure 7:
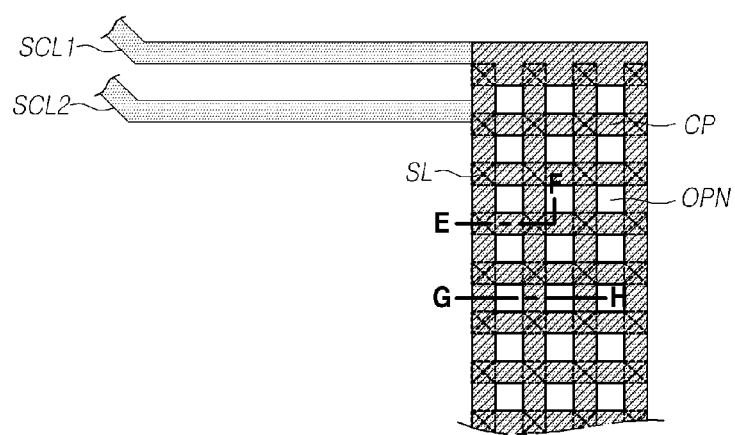
FIG. 7 is a sectional view illustrating a second area corresponding to a part of the X area of FIG. 2.
Figure 8:
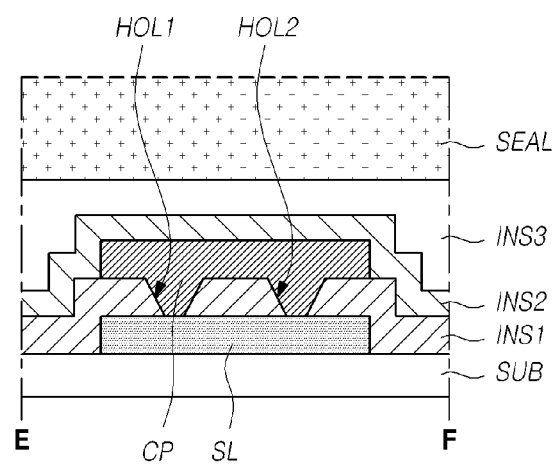
FIG. 8 is a cross-sectional view taken along line E-F of FIG. 7.
Figure 9:
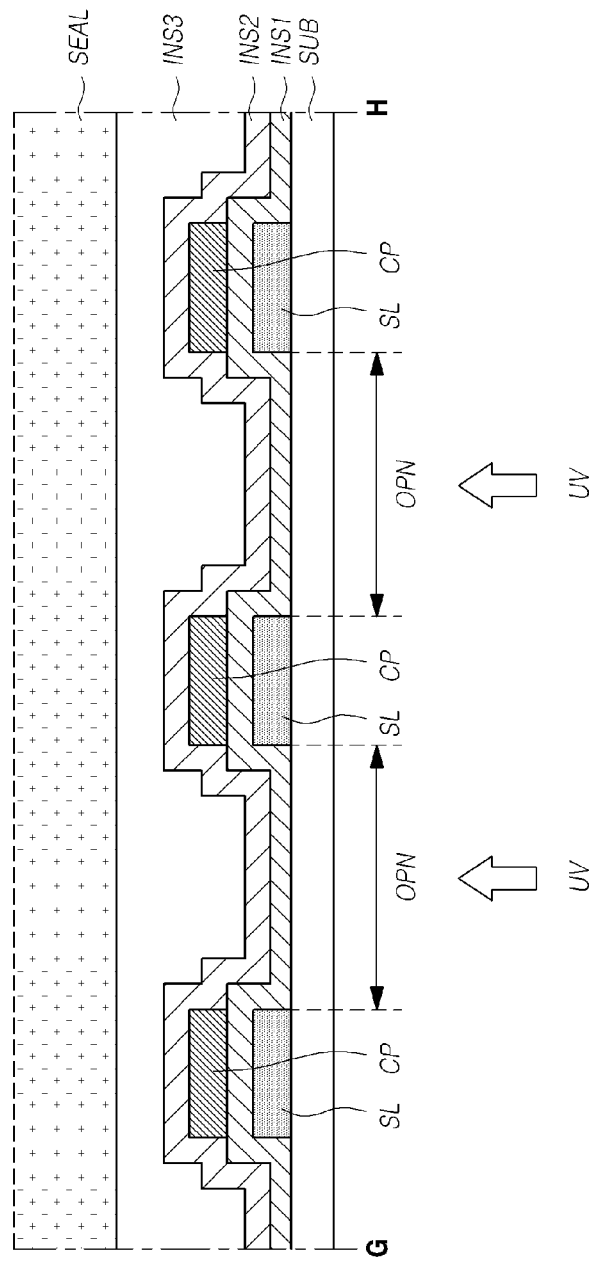
FIG. 9 is a cross-sectional view taken along line G-H of FIG. 7.

FIG. 7 is a sectional view illustrating the second area corresponding to a part of the X area of FIG. 2. FIG. 8 is a cross-sectional view taken along line E-F of FIG. 7. FIG. 9 is a cross-sectional view taken along line G-H of FIG. 7.

The second area A2 of the non-active area N/A can be an area in which at least one signal line SL and at least one connection pattern CP are electrically connected for transferring a signal transferred from a circuit film to the active area A/A.

For example, referring to FIG. 7, a signal (e.g., a common voltage etc.) from the circuit film is applied to a plurality of signal line extension lines SLC1 and SLC2, and the signal supplied from the circuit film is transferred to a plurality of signal lines SL integrated with respective signal line extension lines SLC1 and SLC2.

At least one opening OPN formed by the intersecting of the plurality of signal lines SL can be provided in the second area A2. Thus, the plurality of signal lines SL can be arranged to intersect one another and thus have a mesh form.

At least one connection pattern CP can overlap the signal lines SL in the area in which the signal lines SL are arranged to have the mesh form by intersecting one another, and be disposed not to overlap all or a part of the opening OPN.

Specifically, in the second area A2, the connection pattern CP can have a shape corresponding to the signal lines SL having the mesh form. In other words, the connection pattern CP disposed in the second area A2 can have a mesh form with an opening on a location corresponding to the opening OPN defined by the signal lines SL.

In addition, as shown in FIG. 7, in at least one area in which the signal lines SL and the connection pattern CP overlap each other, the signal lines and the connection pattern can be electrically connected to each other.

A signal transferred to the signal line SL can be delivered to the connection pattern CP, and the signal delivered to the connection pattern CP can be transferred to the active area A/A.

The connection pattern CP can extend up to the active area A/A. The connection pattern CP extended up to the active area A/A can be connected to a common line disposed in the active area A/A.

The connection pattern CP can be disposed on the same layer as the source electrode and the drain electrode of one of a plurality of thin film transistors disposed in the active area A/A. The connection pattern CP can be electrically connected to the common line through a contact hole provided on at least one insulating film disposed between the connection pattern CP and the common line.

Specifically, referring to FIG. 8, a signal line SL can be disposed on the substrate SUB.

A first insulating film INS1 can be disposed on the signal line SL.

A connection pattern CP can be disposed on the first insulating film INS1.

The connection pattern CP can be electrically connected to the signal line SL through a plurality of holes HOL1 and HOL2 formed in the first insulating film INS1.

The signal line SL can be disposed on the same layer as a gate line GL disposed in the active area A/A, and the connection pattern CP can be disposed on the same layer as a data line DL disposed in the active area A/A; but embodiments of the present disclosure are not limited thereto.

A second insulating film INS2 and a third insulating film INS3 can be disposed on the connection pattern CP.

A sealant SEAL can be disposed on the third insulating film INS3.

As shown in FIG. 9, a material as the sealant SEAL can be hardened or cured by ultraviolet light from an area in which the opening OPN of the signal lines SL is located.

Specifically, in the second area A2, since only the insulating films INS1, INS2 and INS3 are disposed over the substrate SUB in an area corresponding to the opening OPN of the signal lines SL, thus, ultraviolet light can reach sufficiently the material as the sealant SEAL.

Next, discussions are provided below on the third area of the non-active area N/A.

Figure 10:
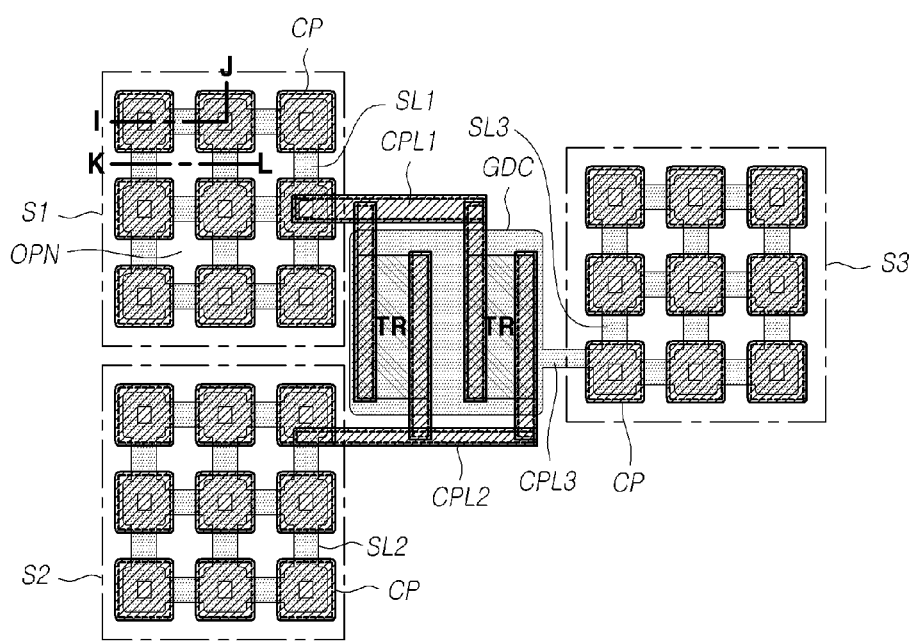
FIG. 10 is a sectional view illustrating a third area corresponding to a part of the X area of FIG. 2.
Figure 11:
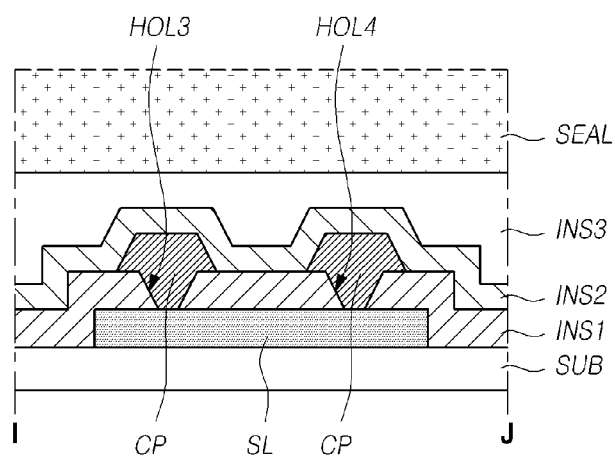
FIG. 11 is a cross-sectional view taken along line I-J of FIG. 10.
Figure 12:
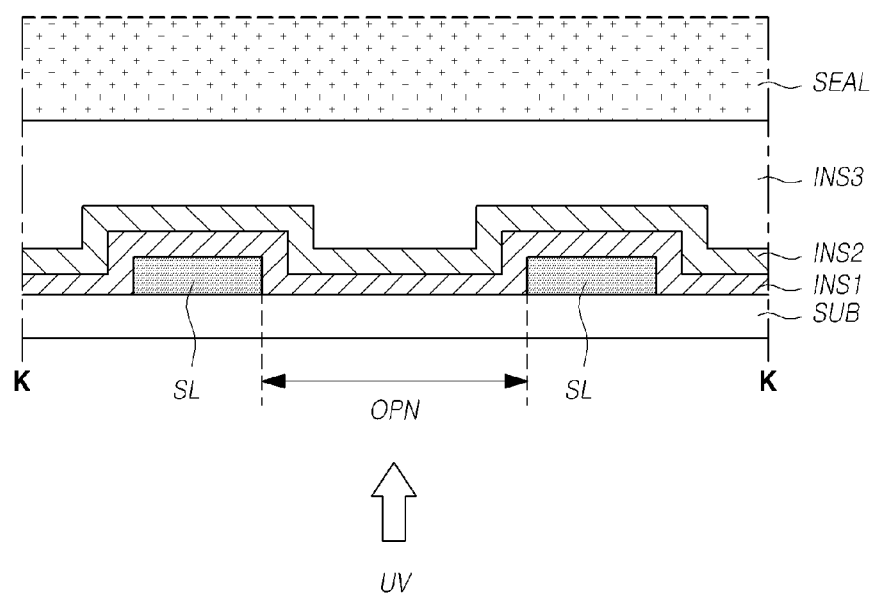
FIG. 12 is a cross-sectional view taken along line K-L of FIG. 10.

FIG. 10 is a sectional view illustrating the third area corresponding to a part of the X area of FIG. 2. FIG. 11 is a cross-sectional view taken along line I-J of FIG. 10. FIG. 12 is a cross-sectional view taken along line K-L of FIG. 10.

The third area A3 of the non-active area N/A can comprise all or a part of at least one gate driving circuit GDC. The gate driving circuit GDC can comprise one or more transistors TR.

The plurality of signal lines SL disposed in the third area A3 can be electrically connected to at least one gate driving circuit. For example, as shown in FIG. 10, one gate driving circuit GDC can be electrically connected to at least three signal lines SL, but embodiments of the present disclosure are not limited thereto.

Specifically, referring to FIG. 10, a plurality of connection pattern extension lines CPL1, CPL2 and CPL3 can electrically connected to the gate driving circuit GDC. Each of the plurality of connection pattern extension lines CPL1 and CPL2 can be electrically connected to at least one transistor TR included in the gate driving circuit GDC.

Here, a first connection pattern extension line CPL1 can be connected to a connection pattern CP overlapping a first signal line SL1. Further, a second connection pattern extension line CPL2 can be connected to a connection pattern CP overlapping a second signal line SL2.

Here, each of the signal lines SL1 and SL2 overlapping the connection patterns CP can comprise at least one opening OPN.

Further, a third connection pattern extension line CPL3 can be electrically connected to a third signal line SL3. The third signal line SL3 can overlap at least one connection pattern disposed on the third signal line SL3.

Here, a timing signal can be applied to one of the first and second signal lines SL1 and SL2, and a voltage can be applied to the other of the first and second signal lines SL1 and SL2. However, embodiments of the present disclosure are not limited thereto.

The timing signal and the voltage applied to the first and second signal lines SL1 and SL2 can be supplied to the gate driving circuit GDC through the connection patterns CP and the first and second connection pattern extension lines CPL1 and CPL2. Further, a gate scan signal from the gate driving circuit GDC can be applied to the third connection pattern extension line CPL3; embodiments of the present disclosure are not limited thereto.

Meanwhile, the plurality of connection patterns CP disposed in the third area A3 can overlap a signal line SL with at least one opening OPN, and connection patterns CP can be disposed to spaced apart from one another. The plurality of connection patterns CP can be disposed not to cover all or a part of the opening OPN of the signal lines SL.

In FIG. 10, the plurality of connection patterns CP is disposed to be spaced apart from one another on the signal line SL; embodiments of the present disclosure are not limited thereto. For example, as shown in FIG. 7, the connection pattern CP can have the mesh form, and be disposed not to overlap the opening OPN of the signal line SL.

For example, the plurality of connection patterns CP disposed in the third area A3 can be disposed not to cover the opening OPN of the signal line SL; thus, the sealant SEAL disposed in the third area A3 can be hardened or cured easily or sufficiently.

In addition, as shown in FIG. 11, each connection pattern CP can be electrically connected to the signal line SL in an area in which the plurality of connection patterns CP and the signal line SL overlap each other.

Specifically, referring to FIG. 11, a signal line SL can be disposed on the substrate SUB.

A first insulating film INS1 can be disposed on the signal line SL.

The plurality of connection patterns CP can be disposed on the first insulating film INS1. Each of the plurality of connection patterns CP can be electrically connected to the signal line SL through a plurality of holes HOL3 and HOL4 formed in the first insulating film INS1.

The signal line SL can be disposed on the same layer as a gate line GL disposed in the active area A/A, and the connection patterns CP can be disposed on the same layer as a data line DL disposed in the active area A/A; but embodiments of the present disclosure are not limited thereto.

A second insulating film INS2 and a third insulating film INS3 can be disposed on the connection patterns CP.

A sealant SEAL can be disposed on the third insulating film INS3.

As shown in FIG. 12, a material as the sealant SEAL can be hardened or cured by ultraviolet light from an area in which the opening OPN of the signal line SL is located.

Specifically, in the third area A3, since only the insulating films INS1, INS2 and INS3 are disposed over the substrate SUB in an area corresponding to the opening OPN of the signal line SL, ultraviolet light can thus reach sufficiently the material as the sealant SEAL.

Meanwhile, the sealant SEAL is disposed in the first area A1 in FIGS. 5 and 6, the sealant SEAL is disposed in the second area A2 in FIGS. 8 and 9, and the sealant SEAL is disposed in the third area A3 in FIGS. 11 and 12. However, embodiments of the present disclosure are not limited thereto.

Specifically, in some embodiments, the sealant SEAL can be disposed in at least one of the first, second and third areas A1, A2 and A3.

In accordance with embodiments of the present disclosure, it is possible to provide a display panel and a display device having a structure for allowing a sealant disposed in a non-active area to be harden or cured sufficiently.

In accordance with embodiments of the present disclosure, it is possible to provide a display panel and a display device having a structure for allowing a sealant material disposed in a non-active area to be harden or cured rapidly.

In accordance with embodiments of the present disclosure, it is possible to provide a display panel and a display device having a structure for allowing a size of a non-active area to be reduced.

The features, structures, configurations, and effects described in the present disclosure are included in at least one embodiment but are not necessarily limited to a particular embodiment. A person skilled in the art can apply the features, structures, configurations, and effects illustrated in the particular embodiments to one or more other additional embodiments by combining or modifying such features, structures, configurations, and effects. It should be understood that all such combinations and modifications are included within the scope of the present disclosure. Although the exemplary embodiments have been described for illustrative purposes, a person skilled in the art will appreciate that various modifications and applications are possible without departing from the essential characteristics of the present disclosure. For example, the specific components of the exemplary embodiments can be variously modified. The scope of protection of the present disclosure should be construed based on the following claims, and all technical ideas within the scope of equivalents thereof should be construed as being included within the scope of the present disclosure.

What is claimed is:

1. A display device comprising:
   a panel comprising:
      a substrate comprising an active area, and a non-active area surrounding the active area and comprising a first area, a second area and a third area which are spaced apart from one another;
      at least one signal line disposed in each of the first, second and third areas; and
      a sealant disposed in the non-active area,
   wherein the display device further comprises a plurality of connection patterns disposed over the at least one signal line,
      wherein in the at least one of the first, second and third areas, the at least one signal line and the plurality of connection patterns overlap each other, and the at least one signal line comprises an area in a form of a mesh with at least one opening,
   wherein the plurality of connection patterns do not overlap all or a part of the at least one opening,
   wherein the sealant overlaps at least one of the first, second and third areas,
   wherein at least one gate driving circuit is disposed in the third area, at least some of the plurality of connection patterns are connected to at least one connection pattern extension line,
   wherein the at least one connection pattern extension line is connected to at least one transistor of the gate driving circuit,
   wherein the plurality of connection patterns are arranged in an island shape, and
   wherein each connection pattern among the plurality of connection patterns is disposed on an intersection of a signal line disposed in a first direction and another signal line disposed in a second direction crossing the first direction.

2. The display device according to claim 1, wherein in the first area, an area in which the at least one signal line has the at least one opening further comprises at least one active layer overlapping a part of the at least one signal line.

3. The display device according to claim 2, wherein a first connection pattern and a second connection pattern are disposed on the at least one active layer, and each of the first and second connection patterns is electrically connected to the at least one active layer.

4. The display device according to claim 3, wherein the first and second connection patterns are disposed to be spaced apart from each other, and each of the first and second connection patterns is connected to a plurality of data lines arranged in the active area.

5. The display device according to claim 1, wherein in the second area, the at least one connection pattern has an opening at a location corresponding to the least one opening of the at least one signal line.

6. The display device according to claim 5, wherein at least one insulating film is disposed between the at least one connection pattern and the at least one signal line disposed in the second area, and the at least one connection pattern is electrically connected to the least one signal line through at least one hole formed in the at least one insulating film.

7. The display device according to claim 5, wherein the at least one connection pattern disposed in the second area is electrically connected to a common line disposed in the active area.

8. The display device according to claim 5, wherein the at least one signal line disposed in the second area is electrically connected to a circuit film connected to the non-active area of the panel.

9. The display device according to claim 1, wherein at least one insulating film is disposed between the plurality of connection patterns and the at least one signal line, and in an area in which the plurality of connection patterns and the at least one signal line overlap each other, each of the plurality of connection patterns is electrically connected to the least one signal line through at least one hole formed in the at least one insulating film.

10. The display device according to claim 1, wherein the sealant overlaps the at least one opening of the at least one signal line.

11. The display device according to claim 1, wherein the first area is closer to the active area than the second area, and the second area is closer to the active area than the third area.

12. A display panel comprising:
   a first substrate comprising an active area, and a non-active area surrounding the active area and comprising a first area, a second area and a third area which are spaced apart from one another;
   at least one signal line disposed in each of the first, second and third areas;
   a plurality of connection patterns disposed over the at least one signal line;
   a second substrate facing the first substrate; and
   a sealant disposed between the first substrate and the second substrate, and disposed in the non-active area,
   wherein in the at least one of the first, second and third areas, the at least one signal line and the plurality of connection patterns overlap each other, and the at least one signal line comprises an area in a form of a mesh with at least one opening,
   wherein the plurality of connection patterns do not overlap all or a part of the at least one opening,
   wherein at least one gate driving circuit is disposed in the third area, at least some of the plurality of connection patterns are connected to at least one connection pattern extension line,
   wherein the at least one connection pattern extension line is connected to at least one transistor of the gate driving circuit,
   wherein the plurality of connection patterns are arranged in an island shape, and
   wherein each connection pattern among the plurality of connection patterns is disposed on an intersection of a signal line disposed in a first direction and another signal line disposed in a second direction crossing the first direction.

* * * * *